United States Patent
Almgren et al.

(10) Patent No.: US 11,621,147 B2
(45) Date of Patent: Apr. 4, 2023

(54) SYSTEMS AND METHODS FOR OPTIMIZING RF PLASMA POWER COUPLING

(71) Applicant: CORNING INCORPORATED, Corning, NY (US)

(72) Inventors: Carl William Almgren, Fort Collins, CO (US); Daniel Robert Boughton, Naples, NY (US); Kenneth Edward Hrdina, Horseheads, NY (US); Stefan Wolfgang Kramel, Ithaca, NY (US); Christopher Scott Thomas, Horseheads, NY (US)

(73) Assignee: CORNING INCORPORATED, Corning, NY (US)

(*) Notice: Subject to any disclaimer, the term of this patent is extended or adjusted under 35 U.S.C. 154(b) by 46 days.

(21) Appl. No.: 17/155,885

(22) Filed: Jan. 22, 2021

(65) Prior Publication Data
US 2021/0384010 A1   Dec. 9, 2021

Related U.S. Application Data

(60) Provisional application No. 62/965,498, filed on Jan. 24, 2020.

(51) Int. Cl.
*H01J 37/32* (2006.01)
*H03H 7/38* (2006.01)

(52) U.S. Cl.
CPC ...... *H01J 37/32183* (2013.01); *H01J 37/321* (2013.01); *H01J 37/32477* (2013.01); *H03H 7/383* (2013.01)

(58) Field of Classification Search
CPC ............... H01J 37/32183; H01J 37/321; H01J 37/32477; H03H 7/383
See application file for complete search history.

(56) References Cited

U.S. PATENT DOCUMENTS

| | | | |
|---|---|---|---|
| 6,770,836 B2 | 8/2004 | Kwon et al. | |
| 7,442,273 B2 | 10/2008 | Kwon et al. | |
| 8,829,468 B2 | 9/2014 | Keller et al. | |
| 9,918,376 B2 | 3/2018 | Thomas et al. | |
| 2012/0168081 A1 | 7/2012 | Son | |
| 2012/0306367 A1* | 12/2012 | Kim | H03H 7/40 315/53 |

(Continued)

FOREIGN PATENT DOCUMENTS

CN   204887662 U   12/2015

OTHER PUBLICATIONS

Montaser, A., et al., "Versatile Impedance Matching Network for Inductively Coupled Plasma Spectrometry", Analytical Chemistry, vol. 61, 1989, pp. 2589-2592.

(Continued)

*Primary Examiner* — Henry Luong

(57) ABSTRACT

A system, having: an RF power source; an RF matching network electrically coupled to the RF power source; an impedance matching circuit electrically coupled to the RF matching network, wherein the impedance matching circuit has a first adjustable capacitor connected in series with the RF matching network and a second adjustable capacitor connected in parallel with the first capacitor; and an inductive process load electrically coupled to the impedance matching circuit.

23 Claims, 6 Drawing Sheets

(56) References Cited

U.S. PATENT DOCUMENTS

2020/0399163 A1   12/2020   Boughton et al.

OTHER PUBLICATIONS

Sudhir, D., et al., "Online Tuning of Impednace Matching Circuit for Long Pulse Inductively Coupled Plasma Source Operation-An Alternate Approach", Review of Scientific Instruments, vol. 85, 2014, pp. 013510-8.

* cited by examiner

SYSTEMS AND METHODS FOR OPTIMIZING RF PLASMA POWER COUPLING

CROSS-REFERENCE TO RELATED APPLICATIONS

This application claims the benefit of priority under 35 U.S.C. § 119 of U.S. Provisional Application Ser. No. 62/965,498 filed on Jan. 24, 2020, the content of which is relied upon and incorporated herein by reference in its entirety.

TECHNICAL FIELD

Embodiments of the present disclosure relate to optimizing RF plasma power coupling. More particularly, embodiments of the present disclosure relate to systems and methods for reducing the capacitive coupling between plasma and surrounding conductive structures in inductively coupled plasma material processing.

BACKGROUND

During the last three decades there has been a broad ranging expansion of the use of atmospheric pressure and vacuum based inductively coupled plasmas for thermal powder spheroidization to the consolidation of ceramic and glass feedstocks. The use of induction devices at high frequency have significant advantages, primarily in their ability to produce higher ionization rates and deliver significant levels of heat transfer using non-reactive gases such as argon and helium. This results in a hydrogen free consolidation environment which is a great concern for quality control in the production of drawn glass fiber for instance. In a more general area of concern, the use of noble gases for plasma production prevents chemical reactions by means of oxygen and/or nitrogen with the substances being consolidated such as fused silica and alumina. Therefore, the industrial motivation for the use of high frequency inductively coupled plasma for thermal processing of glasses and ceramics has expanded significantly.

There are two main means for delivering RF power to produce plasma. The first is capacitively coupled plasma and the second is the aforementioned inductively coupled plasma.

Capacitively coupled plasma is primarily a non-thermal plasma system and is widely used in semiconductor fabrication for etching and thin film deposition processes. Capacitively coupled plasmas are electric field dominant and perform work with charged particles by means of attraction or repulsion of those particles and directing them to substrates primarily in vacuum-based processes where the mean free path is on the order of 0.1 mm to 1mm between particles at a pressure of 50 mtorr to 5 mtorr with a density of $10^{10}$ atoms/cm$^3$. With fewer charged particles the transfer of kinetic energy by those particles to a substrate with a lower kinetic energy from the electric field results in low temperature changes in the substrate. The energies are sufficient to react and deposit materials on the substrate surface however.

Inductively coupled plasmas are used at atmospheric pressures where the mean free path is only 68 nm and is primarily magnetic field dominated which means that the magnetic field from the inductor traps the electrons and ions and forces them to spiral around the magnetic field lines in a concentrated volume space. This results (with an operational frequency band normally from 1 MHz to 40 MHz) where regions of the plasma are in local thermodynamic equilibrium (i.e. the electrons and ions have similar energies). Since ions are much more massive than the electrons, the ions when they impact materials such as glass feedstocks in the plasma will transfer their kinetic energies to the feedstock which is converted to heat in the feedstock. This magnetic field dominance also results in high energy transfers and, since they operate at atmospheric pressures, high particle densities (e.g. $2.7 \times 10^{19}$ atoms/cm$^3$). Both factors lend to a significant energy transfer means when compared to capacitively coupled plasmas. This is the main reason why inductively coupled atmospheric pressure plasmas are used for material processing such as consolidation of optical fiber feedstocks and annealing of optical glass fibers.

The use of RF inductors in circuitry results in a high Q inductance which is the ratio of reactance to resistance. For example, a 3 turn 150 mm coil had a measured impedance of 0.2Ω+j51.1Ω at 13.56 MHz. The Q of this coil is then 51.1/0.2=256 resulting in a sharp tune point for the inductor. To convey maximum power from commercial RF generators which have a standard output impedance of 50.0Ω+j0Ω requires an impedance matching circuit. Therefore, the impedance of the matching components plus the impedance of the inductor must present a 50.0Ω+j0Ω impedance to the RF generator. The first term in the complex impedance is the resistance and the second term is the reactance. Since an inductor is primarily a reactive component it cannot have a 0Ω reactance. Therefore, RF circuitry must be placed between the inductor and the RF generator to transform the complex impedance of the inductor to the 50.0Ω resistive impedance of the RF generator. Such a circuit is called an impedance matching network and these devices are commercially designed and manufactured. However, they are manufactured for use with small scale inductors which produce a lower voltage and typical matchwork voltage ratings are in the 8 kV pk maximum range while a few can go as high as 15 kV pk. It has been experimentally found that a 5-turn inductor that is 60 mm in diameter resulted in a voltage of 4 kVpk with only 100 W input power and at 300 W the voltage rose to 7295 V pk. The commercial matching network used with this inductor had a 5 kV pk maximum rating but with a power rating of 5 kW. The required power needed for melting by the RF generator was 1.5 kW which would result in a voltage on the inductor far exceeding the rating of the commercial matching network. Considering that 300 W resulted in a 7.3 kV pk voltage the application of 1.5 kW would even further stress the matching network's voltage rating. Secondly, the inductor being only 5 turn and of small diameter exceeding the voltage limits of the commercial matching network implies that larger coils with higher inductance would result in even higher voltages. The voltage on the inductor is given by:

$$V_L = -L\frac{di}{dt}$$

where the voltage on the inductor $V_L$ is equal to the inductance L times the rate of change of the current (di/dt). The negative sign indicates that the voltage produced opposes the change in current. At high frequency such as used in the previous example which was 13.56 MHz, ¼ of the period for the change in current is 0.0184 μs. The inductor had a measured complex impedance of 0.34Ω+j141Ω the inductor was made of silver-plated copper with broad conductive areas, so the resistance was very low (340 mΩ). With 100 W of applied power the current would then be, according to Ohm's law:

$$i = \sqrt{\frac{p}{r}}$$

where the current i=the square root of the power divided by the resistance or 17.15 A rms or 24.3 A pk. The rate of change of the current is then, when measured at ¼ of the period: $24.3/0.0184 \times 10^{-6} = 1,317,940,217$ A/s. The inductance measured out at 1.55 µH and so the voltage would then be 2043 V pk as an average over each quarter wave cycle. Obviously with small ΔT near the peak current the voltages would peak much higher. This indicates that the use of inductors, especially sizes for large thermal processing inductively coupled plasma torches, will result in very high voltages that stress the components of a commercially available impedance matching network if not cause them to fail.

The second issue with commercially available impedance matching networks is that they are designed for specific applications (i.e. a single inductor application). If it is desired to use the matching network and RF generator for another inductor with different shapes (turns, spacing, length, etc.) the matching network will in most cases not have the impedance tuning range and even if it does may not have the voltage and current rating needed to support the new inductor. Universally, a single impedance matching network is designed, fabricated from a commercial vendor which is designed for small inductances such as the ones used for reactive ion etch vacuum systems. But when the inductors needed are larger (e.g. >1 µH) the voltages produced at resonance become significantly larger making standard matching network designs insufficient for the application.

Accordingly, there is a need in the art to provide the flexibility to use a single RF generator and a single impedance tuning network on various inductively coupled plasma applications >1 µH. Without embodiments of the present disclosure, the atmospheric pressure plasma fiber reheat, the plasma linear RF source development for PECVD and surface modification at atmospheric pressure, and the vacuum plasma fiber blank consolidation CVD systems would not be practical.

SUMMARY OF THE CLAIMS

Embodiments of systems and methods for reducing the capacitive coupling between plasma and surrounding conductive structures in inductively coupled plasma material processing are described herein. In some embodiments, a system includes: an RF power source; an RF matching network electrically coupled to the RF power source; an impedance matching circuit electrically coupled to the RF matching network, wherein the impedance matching circuit has a first adjustable capacitor connected in series with the RF matching network and a second adjustable capacitor connected in parallel with the first capacitor; and an inductive process load electrically coupled to the impedance matching circuit.

In some embodiments, an inductively coupled plasma processing supporting system includes: an RF power source; an RF matching network electrically coupled to the RF power source; an impedance matching circuit electrically coupled to the RF matching network, wherein the impedance matching circuit has a first adjustable capacitor connected in series with the RF matching network and a second adjustable capacitor connected in parallel with the first capacitor; and a plasma containment tube electrically coupled to the impedance matching circuit; a plasma source fluidly coupled to the plasma containment tube and configured to supply a plasma source gas to the plasma containment tube.

In some embodiments, a method of processing an optical fiber includes: injecting a plasma source gas into a plasma containment vessel; igniting a plasma from the plasma source gas via an induction coil disposed about the plasma containment vessel, wherein the induction coil is electrically coupled to an RF power source via an RF matching network and an impedance matching circuit electrically coupled to the RF matching network, wherein the impedance matching circuit has a first adjustable capacitor connected in series with the RF matching network and a second adjustable capacitor connected in parallel with the first capacitor; and passing a drawn fiber through the plasma containment vessel, wherein the plasma containment vessel comprises: a wall member having an outer surface and an inner surface, at least one internal channel within the wall member configured to carry a cooling fluid, wherein the cooling fluid is deionized water having a resistivity of 18 mega-ohm, an inner volume defined by the inner surface of the wall member, and a plasma containing region within the inner volume.

Other embodiments and variations of the present disclosure are discussed below

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. The appended drawings illustrate only typical embodiments of the disclosure and are not to be considered limiting of the scope, for the disclosure may admit to other equally effective embodiments.

DETAILED DESCRIPTION

Figure 1:
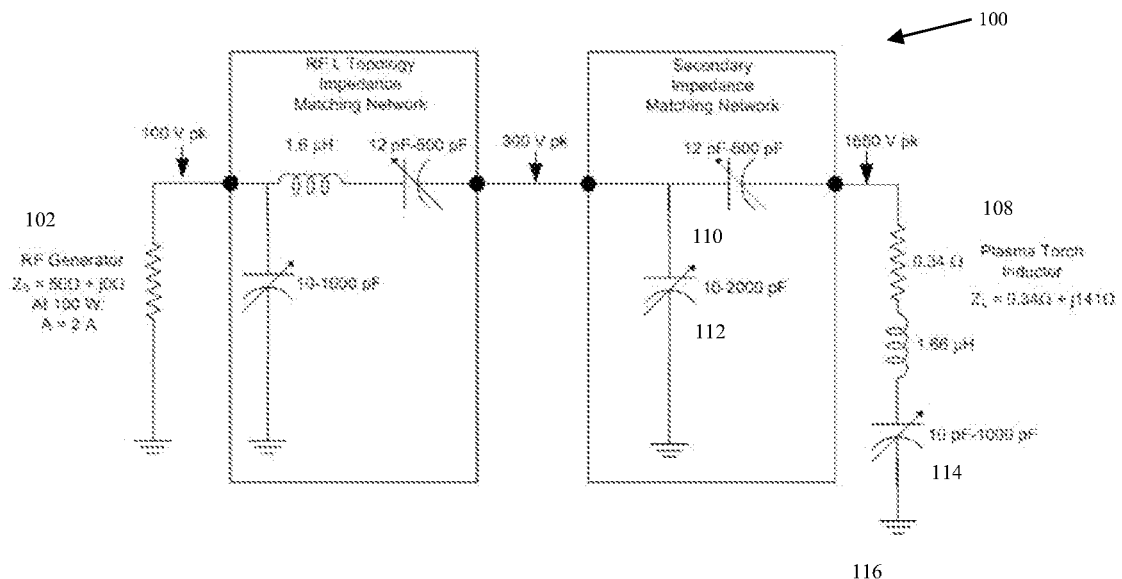
FIG. 1 depicts an electrical schematic diagram of an inductively coupled plasma system in accordance with some embodiments of the present disclosure.

Reference will now be made in detail to embodiments of the present disclosure, examples of which are illustrated in the accompanying drawings. Whenever possible, the same reference numerals will be used throughout the drawings to refer to the same or like parts. However, this disclosure may be embodied in many different forms and should not be construed as limited to the embodiments set forth herein.

Ranges can be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

Directional terms as used herein—for example up, down, right, left, front, back, top, bottom, vertical, horizontal—are made only with reference to the figures as drawn and are not intended to imply absolute orientation.

Unless otherwise expressly stated, it is in no way intended that any method set forth herein be construed as requiring that its steps be performed in a specific order, nor that with any apparatus, specific orientations be required. Accordingly, where a method claim does not actually recite an order to be followed by its steps, or that any apparatus claim does not actually recite an order or orientation to individual components, or it is not otherwise specifically stated in the claims or description that the steps are to be limited to a specific order, or that a specific order or orientation to components of an apparatus is not recited, it is in no way intended that an order or orientation be inferred, in any respect. This holds for any possible non-express basis for interpretation, including: matters of logic with respect to arrangement of steps, operational flow, order of components, or orientation of components; plain meaning derived from grammatical organization or punctuation, and; the number or type of embodiments described in the specification.

As used herein, the singular forms "a," "an," and "the" include plural references unless the context clearly dictates otherwise. Thus, for example, reference to "a" component includes aspects having two or more such components, unless the context clearly indicates otherwise.

All numerical ranges utilized herein explicitly include all integer values within the range and selection of specific numerical values within the range is contemplated depending on the particular use.

Embodiments of the present disclosure advantageously allows for the use of commercially standard designed impedance RF power matching networks without exceeding their specifications with large load inductances for high power RF inductively coupled plasma systems thereby providing a significant capital equipment cost savings to the overall RF power delivery system. Embodiments of the present disclosure also advantageously provide: a means for impedance matching large inductances with high reactances in the range of commercially available impedance matching networks, ease of replacement of individual components or adaptation for a wide variety of plasma inductor requirements, and the ability to adjust the load impedance such that the application of RF power to ignite the plasma is in the commercial autotuning matching network tuning range and once the plasma is lit with its corresponding load impedance shift remains in the tuning range of the commercial autotuning matching network FIG. 1 depicts a schematic representation of a system 100 in accordance with some embodiments of the present disclosure. The system 100 can be used in a variety of plasma assisted processes to ignite and/or maintain a plasma. Exemplary processes include but are not limited to: optical fiber reheating and surface treatment, ablation/cleaning, surface activation/surface modification, or melting/consolidation of glass or ceramic substrates, and plasma enhanced chemical vapor deposition, and plasma enhanced physical vapor deposition.

The system 100 comprises an RF power source 102, an RF matching network 104, an impedance matching circuit 106, and an inductive process load 108. The RF power source 102 is electrically coupled to the RF matching network 104. In some embodiments, the RF power source 102 is a 10.5 kW, 13.56 MHz RF power generator. The system 100 is not limited to the specific RF power source described herein and may utilize other suitable commercially available RF power sources based on factors such as the power requirements of the specific manufacturing process and/or equipment. In some embodiments, the RF matching network 104 is an Advanced Energy Variomatch 13.56 Hz, 5 kW matching network. The system 100 is not limited to the specific RF matching network described herein and may utilize other suitable commercially available matching networks based on factors such as the power requirements of the specific manufacturing process and/or equipment.

The impedance matching circuit 106 is electrically coupled to the RF matching network 104 and to the inductive process load 108. In some embodiments, the impedance matching circuit 106 has a first adjustable capacitor 110 connected in series with the RF matching network 104 and a second adjustable capacitor 112 connected in parallel with the first capacitor 110. In some embodiments, the impedance matching circuit 106 has one of an L-shaped topology, a T-shaped topology or a π-shaped topology. The term "topology" refers to the form taken by the network of interconnections of the circuit components. FIG. 1 depicts an impedance matching circuit 106, where the adjustable capacitors 110, 112 have an L-shaped topology.

In some embodiments, the first adjustable (i.e. variable) capacitor 110 is a vacuum variable capacitor with a capacitance of 12 pF to 500 pF at an RF power frequency of 13.56 MHz. In some embodiments, the RF power frequency may be increased or decreased from 13.56 MHz necessitating an adjustment in the capacitance of the capacitor. For example, if the RF power frequency is 4 MHz, the capacitor may have a capacitance of 12 pf to 2000 pf. In some embodiments, the first adjustable capacitor 110 has a maximum voltage rating of 15 kVpk. In some embodiments, the first adjustable capacitor 110 has a maximum current rating of 79 A pk.

In some embodiments, the second adjustable capacitor 112 is a vacuum variable capacitor with a capacitance of 20 pF to 2000 pF at an RF power frequency of 13.56 MHz. In some embodiments, the RF power frequency may be increased or decreased from 13.56 MHz necessitating an adjustment in the capacitance of the capacitor. In some embodiments, the second adjustable capacitor 112 has a maximum voltage rating of 5 kVpk. In some embodiments, the second adjustable capacitor 112 has a maximum current rating of 77 A.

In some embodiments, the inductive process load 108 is an inductively coupled plasma reactor. In some embodiments, the inductive process load 108 is a 5 turn 66 mm internal diameter (ID) inductor coated with a thin dielectric material, such as Teflon®, for dielectric strength between the inductor turns, having a measured complex induction of $0.34\Omega+j141\Omega$.

Figure 2:
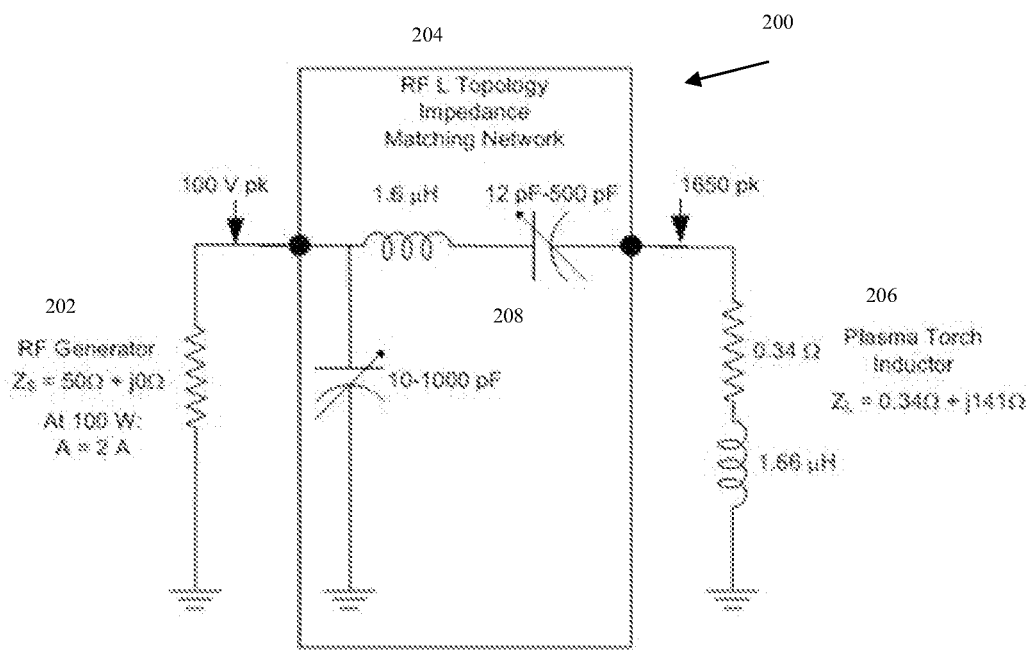
FIG. 2 depicts an electrical schematic diagram of a conventional RF power plasma delivery system in accordance with some embodiments of the present disclosure.

FIG. 2 depicts an electrical schematic diagram of a conventional RF power plasma delivery system 200 having an RF power source 202, a RF matching network 204, and an inductive process load 206. The system 200 does not have the exemplary impendence matching circuit depicted in FIG. 1. The electrical schematic of FIG. 2 depicts 100 W of RF power being output from the RF power source 202 with a $50\Omega+j0\Omega$ impedance. The input of the RF matching network 204 sees a voltage of 100 V pk but the output of the RF matching network 204 sees a measured value of 1,650 V pk connected to the top turn of the inductive process load 206. The series capacitor 208 in the RF matching network 204 has a rating of 5 kV pk and a tuning range of 12 pF to 500 pF. If the power level of the RF power source 202 is set to the level needed for melting (e.g. 1.5 kW) the voltage will far exceed the series capacitor rating of the RF matching network 204.

Embodiments of the present disclosure resolve this problem, as shown in FIG. 1 where the same 100 W power level is sent out of the RF power source 102 resulting in a 100 V pk signal at the input of the RF matching network 104. By placing impedance matching circuit 106 on the output of the RF matching network 104 between the RF matching network 104 and the inductive process load 108 the impedance matching circuit 106 reduces the voltage on the output of the RF matching network 106 to 300 V pk, thereby reducing high voltage stress. The potential difference across the first adjustable capacitor 110 between the RF matching network 106 and the inductive process load 108 is 1,350 V pk and with the first adjustable capacitor 110 having a maximum voltage rating of 15 kV pk; the stress on the first adjustable capacitor 110 is greatly reduced. The second adjustable capacitor 112 produces a secondary current feed during half of the cycle to the inductive process load 108 further reducing the current demand through the RF matching network 104, thereby further reducing stress on the RF matching network 104 and enabling much higher power operational capabilities than possible without embodiments of the present disclosure. To shift the high voltage from the top turn of the inductive process load 108 as shown, the system 100 further comprises a third adjustable capacitor 114 placed between the lower end of the inductive process load 108 and the ground 116. The third adjustable capacitor 114 is adjusted so that the high voltage is centered on the middle turn of the inductive process load 108, thereby stabilizing the plasma oscillations along the length of the inductive process load 108. In some embodiments, the third adjustable capacitor 114 is a 10 pF to 1000 pF vacuum variable capacitor.

Figure 4:
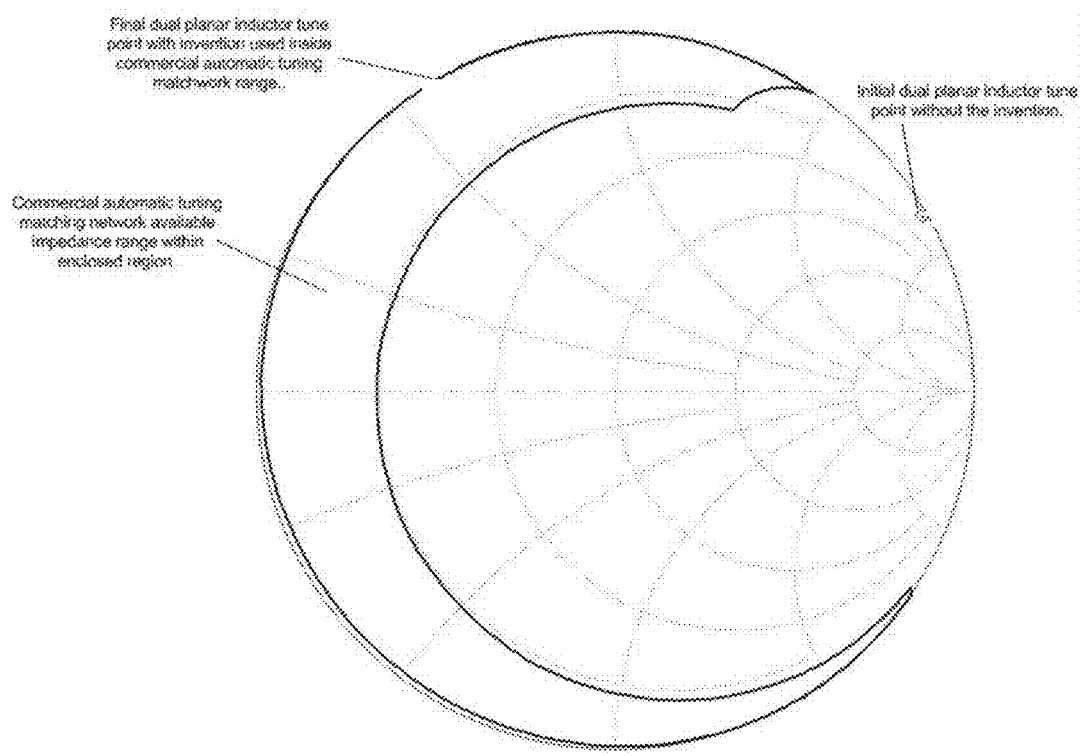
FIG. 4 depicts a Smith Chart which shows the available load impedance tuning range of a commercially available automatic impedance matching network operating at 13.56 MHz in accordance with some embodiments of the present disclosure.

FIG. 4 depicts a Smith Chart which shows the available load impedance tuning range of a commercially available automatic impedance matching network operating at 13.56 MHz used for semiconductor processes. On the right of the chart, a measurement point shows the large inductive reactance that is needed to be used for a particular application such as dual planar inductors. This inductor is outside the available tuning range of the matching network. Embodiments of the present disclosure enable the inductor to be brought into the tuning range of the commercially available impedance matching network thereby allowing 100% power transfer from the 13.56 MHz RF generator to the inductor minimizing power loss and destressing the costly commercial impedance matching network.

Figure 3:
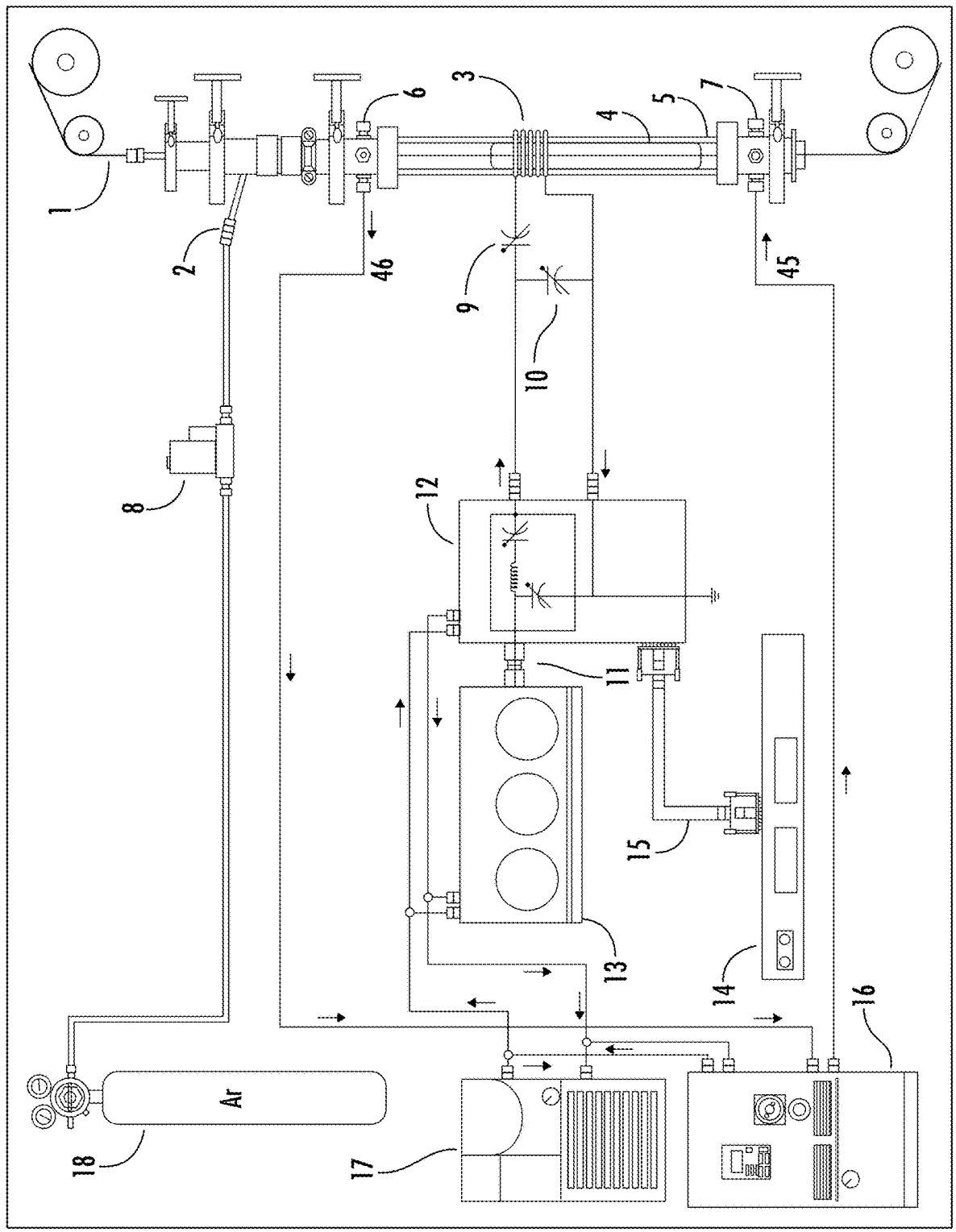
FIG. 3 depicts a schematic representation of a plasma fiber reheat system in accordance with some embodiments of the present disclosure.

FIG. 3 depicts a schematic representation of an exemplary plasma fiber reheat system in accordance with some embodiments of the present disclosure. FIG. 3 depicts a drawn fiber 1 passing through the plasma 4. The plasma 4 is formed in the plasma containment tube 5 by a plasma working gas 2 being supplied by a plasma gas source 18, such as argon or other suitable plasma working gasses such as helium, oxygen, nitrogen, air, or combinations thereof. A water jacket surrounding the plasma containment tube 5 is fed from a high resistivity DI water heat exchanger unit 16 through a feed port and fed into the plasma torch water jacket inlet 7. The high resistivity DI water flows through the water jacket and then out of the plasma torch water jacket outlet 6 where it returns to the heat exchanger unit 16 through the heat exchanger DI water inlet. To cool the heat exchanger unit 15 a standard chiller 17 is employed feeding the heat exchanger unit out of its outlet to the heat exchanger inlet. The return of the coolant from the heat exchanger outlet is fed into the chiller inlet. The chiller also cools the RF generator 13 and the commercial impedance matching network 12 and in turn cools the plasma torch inductor 3 which surrounds the plasma torch body. The RF generator 13 is connected to the commercial impedance matching network 12 by an RF coaxial cable 11. The commercial impedance matching network 12 is controlled via a controller display unit 14 and is connected to the matching network 12 by a communication cable 15. Between the output terminals of the commercial impedance matching unit is placed a parallel vacuum variable capacitor 10. In series with the RF output of the commercial impedance matching network is a vacuum variable capacitor 9 with the other capacitor terminal connected to the top end of the plasma torch inductor 3. The lower end of the inductor returns to the lower end of the parallel vacuum variable capacitor 10 and the grounded RF return of the commercial impedance matching network 12. The system shown in FIG. 3 requires large inductors with high induced voltages at RF frequencies and could not be practical without embodiments of the disclosure presented herein.

Figure 5A:
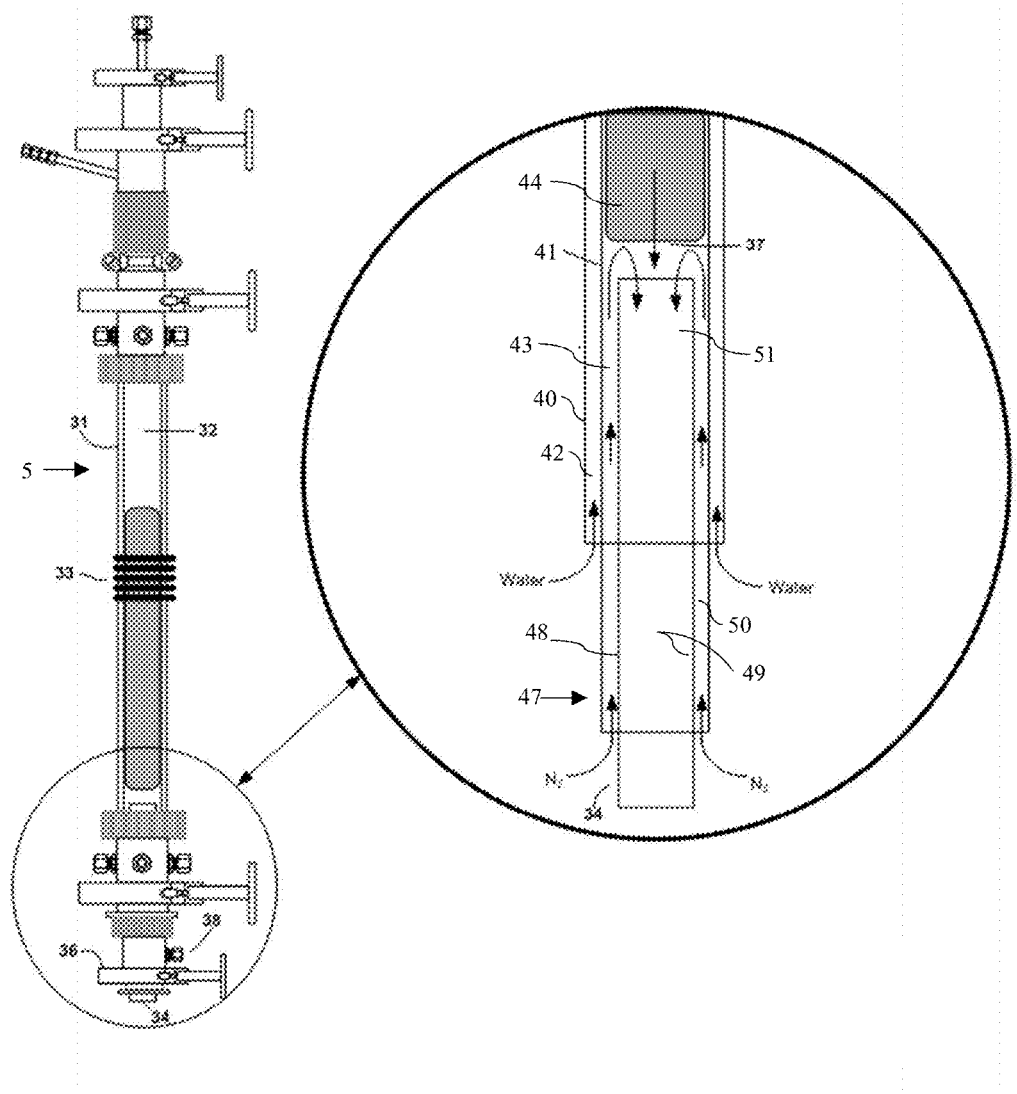
FIG. 5A-5B depicts a schematic representation of a plasma gas quenching system in accordance with some embodiments of the present disclosure.
Figure 5B:
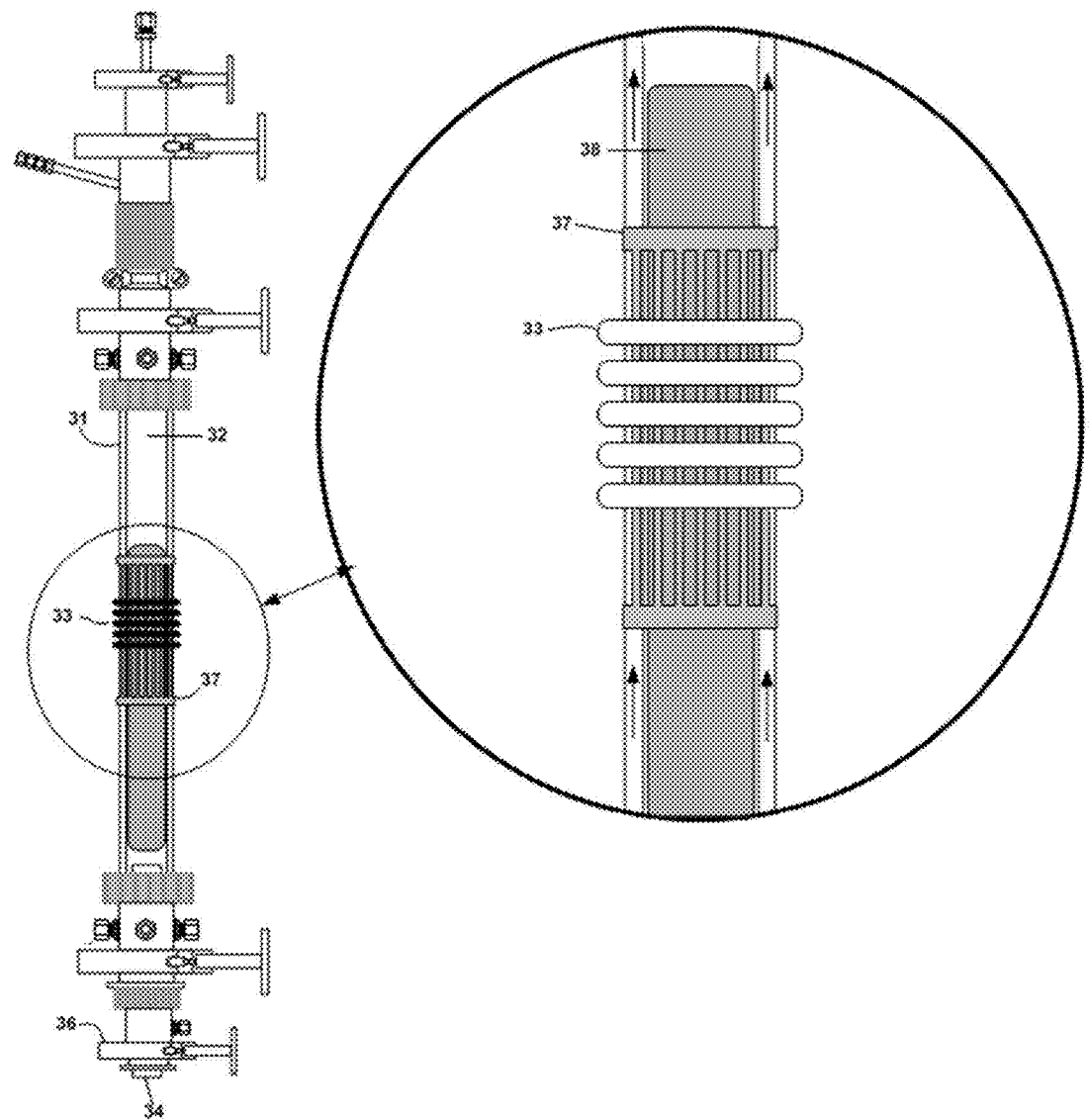
Figure 6:
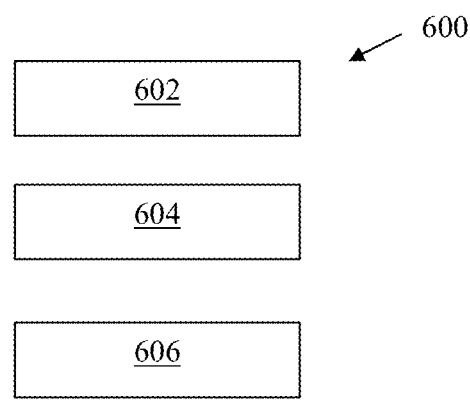
FIG. 6 depicts a flowchart of a method of processing an optical fiber in accordance with some embodiments of the present disclosure To facilitate understanding, identical reference numerals have been used, where possible, to designate identical elements that are common to the figures. The figures are not drawn to scale and may be simplified for clarity. Any of the elements and features of any embodiment disclosed herein may be beneficially incorporated in other embodiments without further recitation.

FIG. 5A-5B shows additional details of the plasma containment vessel 5. The plasma containment vessel 5 comprises a wall member 31 having an outer surface 40 and an inner surface 41, at least one internal channel 42 within the wall member 31 configured to carry a cooling fluid, an inner volume 43 defined by the inner surface 41 of the wall member 31, and a plasma containing region 44 within the inner volume 43. The cooling fluid is deionized water having a resistivity of 18 mega-ohm.

The internal channel 42 has an inlet 45 and an outlet 46. The inlet end 45 receives the cooling fluid from the heat exchanger via any suitable fluid transport system (e.g. piping, tubing). The outlet end 46 discharges the cooling fluid to the heat exchanger unit 16 (shown in FIG. 3) via any suitable fluid transport system. The cooling fluid for the plasma containment vessel 5 is in a closed loop system (i.e. the cooling fluid is isolated from the cooling fluid used for other parts of the system such as the RF generator, the impedance matching network, or the plasma torch RF inductor.)

A dielectric shield tube 34 is partially disposed within the inner volume 43 of the plasma containment vessel 5. The dielectric shield tube 34 comprises a wall member 47 having an outer surface 48 and an inner surface 49. The outer surface 48 of the dielectric shield tube 34 and the outer surface 40 of the plasma containment vessel 5 define a first channel 50 that carries a quench gas toward a top end of the dielectric shield tube 34. The inner surface 49 of the dielectric shield tube 34 defines a second channel 51 that carries the quench gas toward a bottom end of the dielectric shield tube 34. In some embodiments, the quench gas is diatomic nitrogen, oxygen, water vapor, or air.

In some embodiments, the plasma containment vessel 5 comprises a mixing region 37 within the inner volume of the plasma containment vessel. The mixing region 37 is above the top end of the dielectric shield tube 34. Mixing of the plasma quench gas with the plasma source gas in the mixing region causes ions and free electrons in the mixing region to recombine to a neutral state and create a non-plasma zone in the mixing region 37 (i.e. no plasma is formed within the mixing zone). Any gas within the mixing zone is forced down the second channel of the dielectric shield tube 34 by downward action of the plasma source gas.

The plasma containment vessel 5 may include a mechanism configured to receive a source of RF power (not shown) having characteristics sufficient to produce an electromagnetic field within the plasma containment vessel for maintaining a plasma plume from a plasma source gas. For example, the mechanism may include an induction coil 33 disposed about the central axis of the plasma containment vessel 5, and the induction coil may be operable to receive the source of RF power and produce the electromagnetic field. By way of example, the RF power may be of a characteristic such that the electromagnetic field exhibits a frequency of at least one of: (i) at least 1 MHz, (ii) at least 3 MHz, (iii) at least 4 MHz, (iv) at least 5 MHz, (v) at least 10 MHz, (vi) at least 15 MHz, (vii) at least 20 MHz, (viii) at least 30 MHz, (ix) at least 40 MHz, and (x) between about 1 to 50 MHz. The RF power may be at a power level from about 5 kW to 1 MW (or other suitable power level).

A capacitive shield 39 comprising a non-magnetic electrically conductive material is disposed between the induction coil 33 and the outer surface of the plasma containment wall member 40. The shield 39 is cylindrical in shape and made from thin copper greater than 3 um thick but less than 50 um thick. The copper is perforated with vertical slits. In some embodiments, the slits are 4 mm wide and separated from one another by 2 mm gaps. The size and spacing of the slits may be varied based on the application. As the RF inductor increases in size the slit widths and their separation may need to be adjusted to optimize decoupling. The same situation will also arise as the frequency of the RF current source changes. The overall length of the slits is designed to exceed the height of the RF inductor 33 two times and the shield 39 is centered at the center of the RF inductor to balance the degree of coupling at either end of the RF coil 33. However, by decreasing the length of the shield 39, the degree of capacitive coupling may be used for balancing the coupling to the type of plasma being used. The shield 39 may be electrically connected to ground through a fixed value capacitor having a reactance of at least 1 ohm to 100 ohms to block any DC bias field from draining off to ground. When the RF current flows in the inductor, the magnetic field lines are parallel to the slits but the electric field lines are orthogonal in which some are blocked by the shorted vertical conductors. This permits a reduced capacitive coupling between the RF inductor and the plasma near the walls of the plasma containment tube. The copper shield may be deposited by a thin film process directly on the dielectric plasma water jacket tube containing a plasma containment tube or in the case of a plasma torch or reactor containing just a plasma containment tube it can be placed directly on that tube. The deposition of printing of the copper shield can be performed using a mask with the desired shield shape, slot width, and length with the mask being removed once the copper is deposited. Alternatively, the copper can be printed or deposited on a thin polymer sheet which can then be wrapped around the water jacket tube or a plasma containment tube after the copper shield has been printed on the sheet. In the case where the shield reduces the ability to ignite the plasma the shield can be placed on its own thin cylinder or on the polymer sheet mentioned and then slide out of the way until the plasma is ignited. It can then be dropped into place between the RF inductor and the body of the plasma to produce the shielding effect.

The method 600 of processing an optical fiber is described below with respect to the exemplary plasma fiber reheat system depicted in FIG. 3. In the method 600, at step 602 a plasma source gas 2 is injected into the plasma containment vessel 5. Embodiments of an exemplary plasma containment vessel are described above with respect to FIGS. 5A.-5B The plasma source gas is provided by plasma gas source 18. At step 604, the plasma source gas 2 is ignited to form a plasma 4. The plasma source gas 2 is ignited via an induction coil 3 disposed about the plasma containment vessel 5. The induction coil 3 is electrically coupled to an RF power source 13 via an RF matching network 12 and an impedance matching circuit electrically coupled to the RF matching network. The impedance matching circuit has a first adjustable capacitor 10 connected in series with the RF matching network and a second adjustable capacitor 9 connected in parallel with the first capacitor 10. At step 606, a drawn fiber 1 is passed through the plasma containment vessel 5 to heat the fiber 1. The fiber 1 passes through the plasma containment vessel and continues for further processing.

It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

What is claimed is:

1. A system, comprising:
    an RF power source;
    an RF matching network electrically coupled to the RF power source;
    an impedance matching circuit electrically coupled to the RF matching network, wherein the impedance matching circuit has a first adjustable capacitor connected in series with the RF matching network and a second adjustable capacitor connected in parallel with the first capacitor; and
    an inductive process load electrically coupled to the impedance matching circuit.

2. The system of claim 1, wherein the impedance matching circuit has one of an L-shaped topology, T-shaped topology, or a π-shaped topology.

3. The system of claim 1, wherein the first adjustable capacitor is a 12 pF to 500 pF vacuum variable capacitor at an RF power frequency of 13.56 MHz.

4. The system of claim 3, wherein the first adjustable capacitor has a maximum voltage rating of 15 kVpk and a maximum current rating of 79 A pk.

5. The system of claim 1, wherein the second adjustable capacitor is a 20 pF to 2000 pF vacuum variable capacitor.

6. The system of claim 5, wherein the second adjustable capacitor has a maximum voltage rating of 5 kVpk and a maximum current rating of 77 A.

7. The system of claim 1, wherein the first adjustable capacitor is electrically coupled to a top turn of the inductive process load.

8. The system of claim 1, further comprising a third adjustable capacitor electrically coupled to a bottom turn of the inductive process load.

9. The system of claim 8, wherein the third capacitor is a 10 pF to 1000 pF vacuum variable capacitor.

10. An inductively coupled plasma processing supporting system, comprising:
- an RF power source;
- an RF matching network electrically coupled to the RF power source;
- an impedance matching circuit electrically coupled to the RF matching network, wherein the impedance matching circuit has a first adjustable capacitor connected in series with the RF matching network and a second adjustable capacitor connected in parallel with the first capacitor;
- a plasma containment tube electrically coupled to the impedance matching circuit; and
- a plasma source fluidly coupled to the plasma containment tube and configured to supply a plasma source gas to the plasma containment tube.

11. The system of claim 10, wherein the first adjustable capacitor is a 12 pF to 500 pF vacuum variable capacitor at an RF power frequency of 13.56 MHz.

12. The system of claim 11, wherein the first adjustable capacitor has a maximum voltage rating of 15 kVpk and a maximum current rating of 79 A pk.

13. The system of claim 10, wherein the second adjustable capacitor is a 20 pF to 2000 pF vacuum variable capacitor.

14. The system of claim 13, wherein the second adjustable capacitor has a maximum voltage rating of 5 kVpk and a maximum current rating of 77 A.

15. The system of claim 10, wherein the first adjustable capacitor is electrically coupled to a top turn of the plasma containment tube.

16. The system of claim 10, further comprising a third adjustable capacitor electrically coupled to a bottom turn of the plasma containment tube.

17. The system of claim 16, wherein the third capacitor is a 10 pF to 1000 pF vacuum variable capacitor.

18. The system of claim 10, wherein the impedance matching circuit has one of an L-shaped topology, T-shaped topology, or a π-shaped topology.

19. An inductively coupled plasma processing system, comprising:
- an RF power source;
- an RF matching network electrically coupled to the RF power source;
- an impedance matching circuit electrically coupled to the RF matching network, wherein the impedance matching circuit a first adjustable capacitor connected in series with the RF matching network and a second adjustable capacitor connected in parallel with the first capacitor;
- a plasma containment vessel electrically coupled to the impedance matching circuit, wherein the plasma containment vessel comprises:
  - a wall member having an outer surface and an inner surface,
  - at least one internal channel within the wall member configured to carry a cooling fluid, wherein the cooling fluid is deionized water having a resistivity of 18 mega-ohm,
  - an inner volume defined by the inner surface of the wall member, and
  - a plasma containing region within the inner volume;
- a dielectric shield tube partially disposed within the inner volume of the plasma containment vessel, wherein the dielectric shield tube comprises:
  - a wall member having an outer surface and an inner surface, wherein the outer surface of the dielectric shield tube and the outer surface of the plasma containment tube define a first channel configured to carry a quench gas toward a top end of the dielectric shield tube, and wherein the inner surface of the dielectric shield tube defines a second channel configured to carry the quench gas toward a bottom end of the dielectric shield tube;
- an induction coil disposed about the plasma containment vessel, wherein the induction coil is configured to produce an electromagnetic field within the plasma containing region of the plasma containment vessel;
- a capacitive shield comprising a non-magnetic electrically conductive material disposed between the induction coil and the outer surface of the plasma containment wall member; and
- a plasma source fluidly coupled to the plasma containment tube and configured to supply a plasma source gas to the plasma containment tube.

20. The system of claim 19, wherein the impedance matching circuit has one of an L-shaped topology, T-shaped topology, or a π-shaped topology.

21. The system of claim 19, wherein the capacitive shield has a thickness of 3 um to 50 um.

22. The system of claim 19, wherein the capacitive shield comprises a body with a plurality of vertical slits.

23. A method of processing an optical fiber, comprising:
- injecting a plasma source gas into a plasma containment vessel;
- igniting a plasma from the plasma source gas via an induction coil disposed about the plasma containment vessel, wherein the induction coil is electrically coupled to an RF power source via an RF matching network and an impedance matching circuit electrically coupled to the RF matching network, wherein the impedance matching circuit has a first adjustable capacitor connected in series with the RF matching network and a second adjustable capacitor connected in parallel with the first capacitor; and
- passing a drawn fiber through the plasma containment vessel, wherein the plasma containment vessel comprises:
  - a wall member having an outer surface and an inner surface,
  - at least one internal channel within the wall member configured to carry a cooling fluid, wherein the cooling fluid is deionized water having a resistivity of 18 mega-ohm,
  - an inner volume defined by the inner surface of the wall member, and a plasma containing region within the inner volume.

* * * * *

UNITED STATES PATENT AND TRADEMARK OFFICE
CERTIFICATE OF CORRECTION

PATENT NO. : 11,621,147 B2
APPLICATION NO. : 17/155885
DATED : April 4, 2023
INVENTOR(S) : Carl William Almgren et al.

It is certified that error appears in the above-identified patent and that said Letters Patent is hereby corrected as shown below:

On the Title Page

On the page 2, in Column 1, Item (56) under "Other Publications", Line 1, delete "Impednace" and insert -- Impedance --.

In the Claims

In Column 1, Claim 19, Line 54, delete "circuit a first" and insert -- circuit has a first --.

Signed and Sealed this
Twenty-sixth Day of September, 2023

Katherine Kelly Vidal
Director of the United States Patent and Trademark Office